United States Patent
Khan et al.

(10) Patent No.: US 11,792,051 B2
(45) Date of Patent: Oct. 17, 2023

(54) MULTI-CHANNEL DIGITAL ISOLATOR WITH INTEGRATED CONFIGURABLE PULSE WIDTH MODULATION INTERLOCK PROTECTION

(71) Applicant: Texas Instruments Incorporated, Dallas, TX (US)

(72) Inventors: Sadia Arefin Khan, Dallas, TX (US); Anant Shankar Kamath, Bengaluru (IN); Martin Staebler, Freising (DE); Vikas Kumar Thawani, Bengaluru (IN)

(73) Assignee: Texas Instruments Incorporated, Dallas, TX (US)

( * ) Notice: Subject to any disclaimer, the term of this patent is extended or adjusted under 35 U.S.C. 154(b) by 94 days.

(21) Appl. No.: 17/352,663

(22) Filed: Jun. 21, 2021

(65) Prior Publication Data
US 2022/0021562 A1 Jan. 20, 2022

Related U.S. Application Data

(60) Provisional application No. 63/053,158, filed on Jul. 17, 2020.

(51) Int. Cl.
*H04L 25/02* (2006.01)
*H02K 11/33* (2016.01)
(Continued)

(52) U.S. Cl.
CPC .......... *H04L 25/0266* (2013.01); *H02K 11/33* (2016.01); *H02P 27/08* (2013.01);
(Continued)

(58) Field of Classification Search
CPC . H04L 25/0266; H04L 25/4902; H02K 11/33; H02P 27/08; H03K 19/00323; H03K 19/017509; H03K 19/017545
See application file for complete search history.

(56) References Cited

U.S. PATENT DOCUMENTS 8,502,584 B1 * 8/2013 Dong ................. H04B 3/30
375/219
9,621,383 B1 * 4/2017 Urienza .............. H04L 25/0266
(Continued)

FOREIGN PATENT DOCUMENTS

| CN | 110417401 | 11/2019 |
| JP | 2019102822 | 6/2019 |
| WO | 2020005797 | 2/2020 |

OTHER PUBLICATIONS

Machine translation for document DE-112012001395-T5. (Year: 2023).*
(Continued)

*Primary Examiner* — Jean B Corrielus
(74) *Attorney, Agent, or Firm* — Valerie M. Davis; Frank D. Cimino (57) ABSTRACT

A multi-channel digital isolator includes a digital isolator and an interlock circuit. The isolator includes a transmitter having a transmitter output, a receiver having a receiver input and a receiver output, an isolation barrier coupled between the transmitter output and the receiver input, and an output buffer having a buffer input and configured to output an isolated signal. The transmitter is configured to transmit an input signal across the isolation barrier. The interlock circuit has an interlock input coupled to the receiver output and an interlock output coupled to the buffer input. The interlock module is configured to prevent overlapping active states between the first isolated signal and a complementary isolated signal. In some implementations, the digital isolator also includes a dead-time insertion circuit.

22 Claims, 8 Drawing Sheets

(51) Int. Cl.
*H03K 19/0175* (2006.01)
*H03K 19/003* (2006.01)
*H02P 27/08* (2006.01)

(52) U.S. Cl.
CPC ............ *H03K 19/00323* (2013.01); *H03K 19/017509* (2013.01); *H03K 19/017545* (2013.01)

(56) References Cited

U.S. PATENT DOCUMENTS

| | | | |
|---|---|---|---|
| 9,935,763 B2 * | 4/2018 | Kamath | B60Q 1/0483 |
| 2007/0171002 A1 * | 7/2007 | Unkrich | H03H 9/587 |
| | | | 333/189 |
| 2008/0218258 A1 * | 9/2008 | Crawley | H03F 3/45183 |
| | | | 330/10 |
| 2010/0246646 A1 | 9/2010 | Gaalaas | |
| 2013/0099817 A1 * | 4/2013 | Haigh | H03K 19/003 |
| | | | 326/21 |
| 2014/0211862 A1 * | 7/2014 | Moghe | H04B 5/0012 |
| | | | 375/256 |
| 2017/0302225 A1 * | 10/2017 | Kamath | H04L 25/0268 |
| 2021/0359650 A1 * | 11/2021 | Dong | H03F 3/085 |

OTHER PUBLICATIONS

International Search Report in corresponding PCT Application No. PCT/US2021/042136, dated Oct. 7, 2021 (2 pages).

\* cited by examiner

MULTI-CHANNEL DIGITAL ISOLATOR WITH INTEGRATED CONFIGURABLE PULSE WIDTH MODULATION INTERLOCK PROTECTION

CROSS-REFERENCE TO RELATED APPLICATIONS

This application claims priority to U.S. Provisional Application No. 63/053,158, filed Jul. 17, 2020, which is hereby incorporated by reference.

BACKGROUND

Power drivers may include circuitry that provides power to recharge batteries or drive an electric motor. As such, power drivers typically operate at a higher voltage and/or higher current than the logic circuitry that drives them. For example, a power driver may be controlled by a controller that switches on/off transistors in the power driver. One technique for switching these transistors on/off is pulse-width modulation (PWM).

Many power drivers use complementary PWM control signals to ensure that high-side and low-side transistors are not on at the same time, which otherwise would cause shoot-through current that could damage or degrade performance of the power driver and any motors or other systems coupled to the power driver. Some power drivers are galvanically isolated from the digital controllers generating the PWM control signals, to transition the voltage level, to prevent disruptive ground loops, and/or for the electrical safety of any system users from high voltages.

However, complementary PWM control signals can overlap (e.g., both PWM control signals will be at a logic high) during power up or power down of the digital controller (e.g. before the PWM is initialized) or due to faults in the software of the digital controller, the hardware of the isolator, or in the board traces carrying the PWM control signals on the isolated side of the system. Interlock circuits prevent overlap between complementary PWM control signals but may be implemented on the logic side of the system, and thus only correct software faults. In addition, these discrete interlock circuits increase the area, cost, and bill of materials of these systems.

SUMMARY

A multi-channel digital isolator includes a digital isolator and an interlock circuit. The digital isolator includes a transmitter having a transmitter output, a receiver having a receiver input and a receiver output, an isolation barrier coupled between the transmitter output and the receiver input, and an output buffer having a buffer input and configured to output an isolated signal. The transmitter is configured to transmit an input signal across the isolation barrier. The interlock circuit has an interlock input coupled to the receiver output and an interlock output coupled to the buffer input.

The interlock circuit is configured to prevent overlapping active states between the isolated signal and a complementary isolated signal. In some implementations, the digital isolator also includes an inverter and a complementary output buffer. The inverter has an inverter input coupled to the receiver output, and an inverter output coupled to a complementary input of the interlock circuit. The complementary output buffer has a complementary buffer input coupled to a complementary interlock output of the interlock circuit, and is configured to output the complementary isolated signal.

In some implementations, the digital isolator includes a complementary transmitter having a complementary transmitter output, a complementary receiver having a complementary receiver input and a complementary receiver output, and a complementary output buffer having a complementary buffer input and configured to output the complementary isolated signal. The isolation barrier is further coupled between the complementary transmitter output and the complementary receiver input. The complementary transmitter is configured to transmit a complementary input signal across the isolation barrier.

The interlock circuit has a complementary interlock input coupled to the complementary receiver output and a complementary interlock output coupled to the complementary buffer input. The multi-channel digital isolator can also include a dead-time insertion circuit configured to insert a dead-time between a falling edge of the first isolated signal and a rising edge of the complementary isolated signal or between a rising edge of the first isolated signal and a falling edge of the complementary isolated signal.

In some implementations, the interlock circuit includes an exclusive OR (XOR) logic gate, a first AND logic gate, and a second AND logic gate. The XOR logic gate has a first input coupled to the interlock input, a second input coupled to the complementary interlock input, and an XOR output. The first AND logic gate has a first input coupled to the interlock input, a second input coupled to the XOR output, and an output coupled to the interlock output. The second AND logic gate has a first input coupled to the complementary interlock input, a second input coupled to the XOR output, and an output coupled to the complementary interlock output.

The output buffer comprises a buffer output, and the complementary output buffer comprises a complementary buffer output, in some implementations. The interlock circuit has a feedback input coupled to the complementary buffer output, and a complementary feedback input coupled to the buffer output. The interlock circuit includes first and second AND logic gates. The first AND logic gate has an input coupled to the interlock input, an inverting input coupled to the feedback input, and an output coupled to the interlock output. The second AND logic gate has an input coupled to the complementary interlock input, an inverting input coupled to the complementary feedback input, and an output coupled to the complementary interlock output.

The digital isolator can include a dead-time insertion circuit in some implementations. The dead-time insertion circuit has a first dead-time input coupled to the complementary buffer output, a second dead-time input coupled to the buffer output, a first dead-time output coupled to the feedback input, and a second dead-time output coupled to the complementary feedback input. The dead-time insertion circuit includes a first delay circuit having an input coupled to the first dead-time input and an output coupled to the first dead-time output and a second delay circuit having an input coupled to the second dead-time input and an output coupled to the second dead-time output.

In some implementations, the output buffer has a buffer output and the complementary output buffer has a complementary buffer output. The interlock circuit has a feedback input coupled to the complementary buffer output and a complementary feedback input coupled to the buffer output. The interlock circuit includes an XOR logic gate, a first AND logic gate, and a second AND logic gate. The XOR logic gate has a first input coupled to the interlock input, a second input coupled to the complementary interlock input, and an XOR output.

The first AND logic gate has a first input coupled to the interlock input, second input coupled to the XOR output, a first inverting input coupled to the feedback input, and an output coupled to the interlock output. The second AND logic gate has a third input coupled to the complementary interlock input, a fourth input coupled to the XOR output, a second inverting input coupled to the complementary feedback input, and an output coupled to the complementary interlock output.

BRIEF DESCRIPTION OF THE DRAWINGS

For a detailed description of various examples, reference will now be made to the accompanying drawings in which.

The same reference numerals are used in the drawings to designate the same or similar (by function and/or structure) features.

DETAILED DESCRIPTION

The disclosed digital isolators include an interlock circuit configured to prevent overlap between complementary pulse-width modulation (PWM) control signals input to and output from the isolator. The circuitry of some example embodiments corrects software faults as well as faults in signal transmission across the isolation barrier and the traces carrying the PWM control signals output from the isolator. In addition, the circuitry of some example embodiments occupies less area than conventional isolators and interlock circuits. In some examples, the digital isolators receive single-ended PWM control signals and generate the complementary PWM control signal.

Figure 1A:
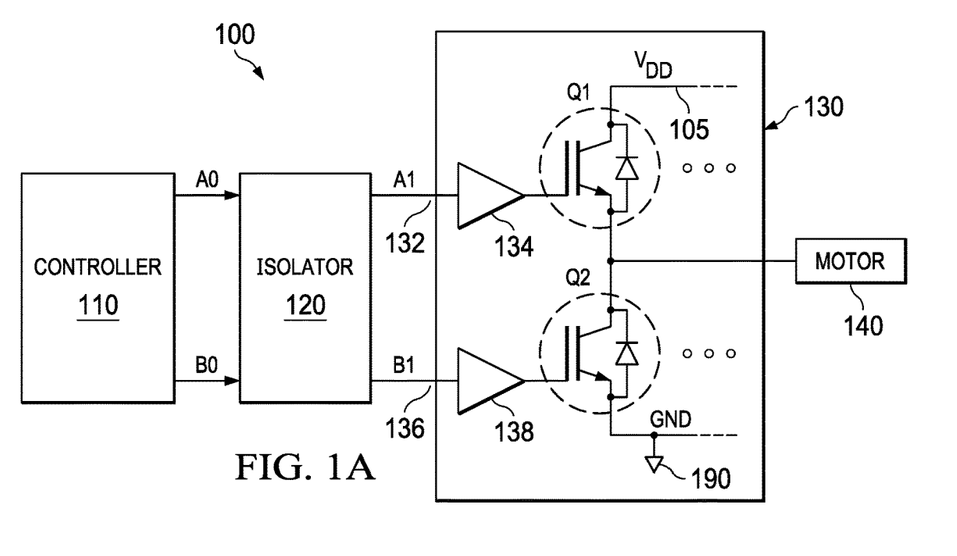
FIG. 1A is a block diagram illustrating an example motor system with an isolator.
Figure 1B:
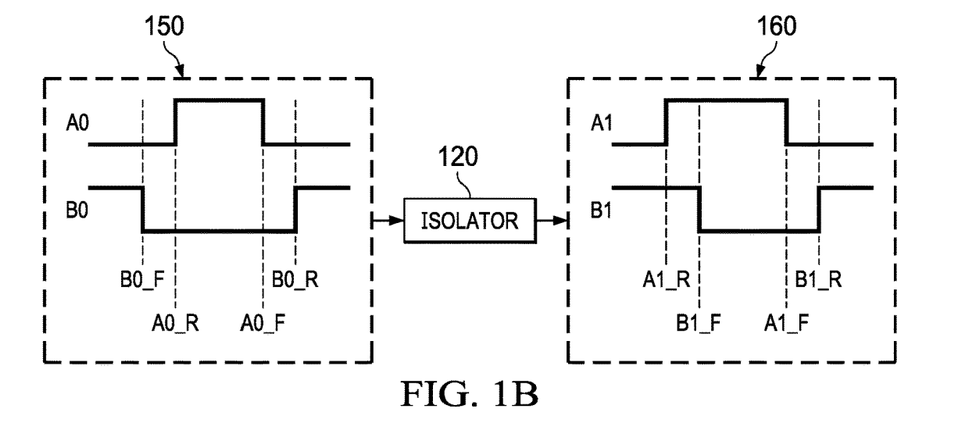
FIGS. 1B and 1C are timing diagrams illustrating control signals within the example motor system shown in FIG. 1A.
Figure 1C:
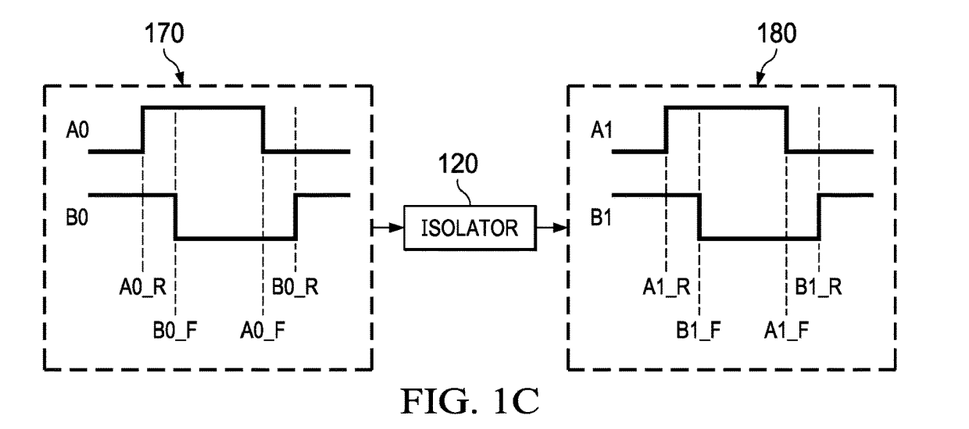

FIG. 1A is a block diagram of a motor system 100 with an isolator 120, that isolates the voltage/ground on one side of the isolation from the voltage/ground on the other side of the isolation. Depending on the type of isolation used for isolation 120, in order for a signal (or voltage) to pass through the isolation it is modulated. FIGS. 1B and 1C are timing diagrams of controls signals within the motor system 100. Motor system 100 shown in FIG. 1A includes a digital controller 110, an isolator 120, a power driver 130, and a motor 140. Any appropriate kind of motor may be used for motor 140, such as a single phase motor, a multi-phase motor (e.g., a three-phase motor), an alternating current (AC) induction motor, a permanent magnet synchronous motor, etc.

Controller 110 outputs PWM control signals A0 and B0 to isolator 120, which galvanically isolates the digital controller 110 from the power driver 130 and motor 140 to transition the voltage level, to prevent disruptive ground loops, and/or for the electrical safety of any system users from high voltages. For example, the isolator 120 isolates the voltage level from a digital supply voltage (e.g., 3.3 volts) for the PWM control signals A0 and B0 from a power supply voltage (e.g., 565 volts) for the isolated PWM control signals A1 and B1. Isolator 120 outputs the isolated PWM control signals A1 and B1 to the power driver 130, which drives the motor 140. Examples of the isolator 120 are provided in FIGS. 2A-B, 3A-C, and 4A and are described below. Power driver 130 includes gate drivers 134 and 138 and transistors Q1 and Q2.

The transistors Q1-Q2 are bipolar junction transistors (BJTs), such as insulated gate bipolar transistors (IGBTs). Q1-Q2 are NPN type BJTs in this example. In other examples, one or more of Q1-Q2 are PNP type BJTs or metal oxide semiconductor field-effect transistors (MOSFETs). A BJT includes a base corresponding to the gate terminal of a MOSFET, and a collector and an emitter corresponding to the drain and source terminals of a MOSFET. The base of a BJT and the gate terminal of a MOSFET are control inputs. The collector and emitter of a BJT and the drain and source terminals of a MOSFET are current terminals. The current through Q1-Q2 can be as large as 500 Amperes, in some examples. In some example embodiments, there may be multiple Q1 transistors in parallel and multiple Q2 transistors in parallel.

Gate drivers 134 and 138 each have an input and an output. The output of isolator 120 that provides the isolated PWM control signal A1 is coupled to the input of gate driver 134, and the output of gate driver 134 is coupled to the base terminal of Q1. The collector of Q1 is coupled to a supply voltage rail VDD 105 (e.g., 565 volts), and an emitter of Q1 is coupled to an output of power driver 130 and a collector of Q2. The output of isolator 120 that provides the isolate PWM control signal B1 is coupled to the input of gate driver 138, and the output of gate driver 138 is coupled to the base terminal of Q2. The emitter of Q2 is coupled to ground 190. Power driver 130 is a half bridge driver in this example but any appropriate power driver may be used, such as a full bridge driver, a two (or more) stage inverter, etc.

Isolator 120 outputs the isolated PWM control signal A1 to the first input 132 of power driver 130 and the isolated PWM control signal B1 to the second input 136 of power driver 130. Gate driver 134 receives isolated PWM control signal A1 and causes Q1 to turn on and off in response to the magnitude of the isolated PWM control signal A1. Gate driver 138 receives isolated PWM control signal B1 and causes Q2 to turn on and off in response to the magnitude of the isolated PWM control signal B1. The output of power driver 130 is coupled to a motor 140. Any appropriate kind of motor may be used, such as an alternating current (AC) induction motor or a permanent magnet synchronous motor.

FIGS. 1B-C illustrate timing diagrams of PWM control signals A0 and B0 input to isolator 120 and isolated PWM control signals A1 and B1 output from isolator 120. The diagrams in FIGS. 1B-C show PWM control signals A0 and B0 and isolated PWM control signals A1 and B1 as active high, but in other implementations PWM control signals A0 and B0 and isolated PWM control signals A1 and B1 can be active low. In FIG. 1B, timing diagram 150 shows the rising edges A0_R and B0_R and falling edges A0_F and B0_F of PWM control signals A0 and B0, respectively, which are input to isolator 120 from controller 110.

PWM control signals A0 and B0 are configured to prevent shoot-through current in power driver 130. That is, the rising edges A0_R and B0_R are offset from the falling edges A0_F and B0_F (a time period referred to as "dead time") such that A0 and B0 are not active high at the same time, and, thus, Q1 and Q2 are not on at the same time. In an implementation in which A0 and B0 are active low, the falling edges A0_F and B0_F are offset from the rising edges A0_R and B0_R such that A0 and B0 are not active low at the same time, and Q1 and Q2 are not on at the same time.

Timing diagram 160 shows the rising edges A1_R and B1_R and falling edges A1_F and B1_F of isolated PWM control signals A1 and B1, respectively, which are output from isolator 120 to the first and second inputs of power driver 130. Although timing diagram 150 shows that the controller 110 imposes a deadtime between one of A0 and B0 being active before the other signal is made active, faults in the isolator 120 and in the traces for the isolated PWM control signals A1 and B1 can cause the falling edge B1_F for B1 to be delayed to after the rising edge A1_R for A1, such that both A0 and B0 are active high at the same time and Q1 and Q2 are on at the same time, causing shoot-through current to occur.

In an implementation in which A0 and B0 are active low, the rising edge B1_R for B1 is delayed to after the falling edge A1_F for A1, such that both A1 and B1 are active low at the same time and Q1 and Q2 are on at the same time, causing shoot-through current to occur. For example, common mode transients can cause the isolator 120 to resolve the isolated PWM control signals A1 and B1 incorrectly. As another example, parasitic capacitance in the traces for the isolated PWM control signals A1 and B1 can introduce delays that cause A1 and B1 to overlap.

In addition to hardware faults in isolator 120 and the traces, a software fault in controller 110 can cause controller 110 to output overlapping control signals A0 and B0. In FIG. 1C, timing diagram 170 shows that the falling edge B0_F for B0 occurs after the rising edge A0_R for A0, and timing diagram 180 illustrates the isolated PWM control signals A1 and B1 output from isolator 120, which show the same error, that is, the falling edge B1_F for B1 occurs after the rising edge A1_R for A1. As a result, Q1 and Q2 are both on at the same time and shoot-through current occurs. Any of the software and/or hardware faults can cause shoot-through current and damage to and/or degrade the performance of the power driver 130 and/or motor 140. In accordance with the described embodiments, an interlock circuit is included in isolator 120 to prevent A1 and B1 from being logic high at the same time.

Figure 2A:
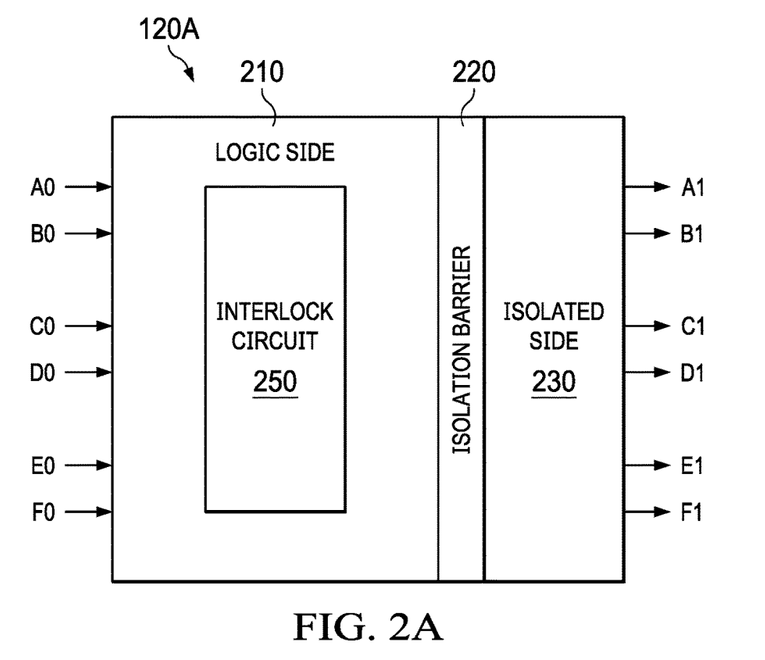
FIGS. 2A and 2B are block diagrams of examples of multi-channel isolators with integrated interlock circuits.
Figure 2B:
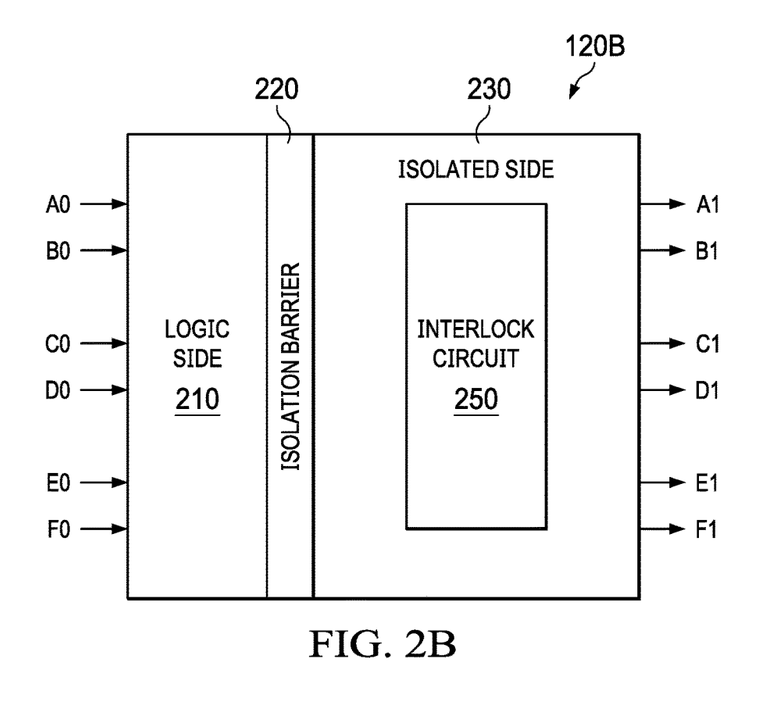

To drive three-phase motors for example, a power driver 130 includes a half bridge driver for each phase of the motor, and thus receives three pairs of isolated PWM control signals. That is, the isolator 120 provides a first pair of isolated PWM control signals A1 and B1, a second pair of isolated PWM control signals C1 and D1, and a third pair of isolated PWM control signals E1 and F1. FIGS. 2A-B illustrate multi-channel isolators 120A and 120B, respectively, with an integrated interlock circuit 250. That is, the interlock circuit 250 is on the same semiconductor die as the multi-channel isolator 120. Each isolator 120 includes an isolation barrier 220 separating the logic side 210 from the isolated side 230. The isolation barrier 220 may be implemented using a transformer, an optocoupler, capacitive isolation, etc.

Multi-channel isolators 120 include six channels for three channel pairs in this example, but any number of channel pairs can be used. FIG. 2A illustrates a six-channel isolator 120A with the interlock circuit 250 arranged on the logic side 210 of the isolation barrier 220. Although isolator 120A can correct for software faults that cause overlapping PWM control signals within a channel pair, it does not correct for faults due to the isolation barrier or the traces for the isolated PWM control signals from isolator 120A to the power driver 130. By contrast, the six-channel isolator 120B of FIG. 2B includes an interlock circuit 250 arranged on the isolated side 230 of isolator 120B. Isolator 120B is able to correct software faults, as well as faults due to the isolation barrier and/or in some implementations the traces for the isolated PWM control signals.

Figure 3A:
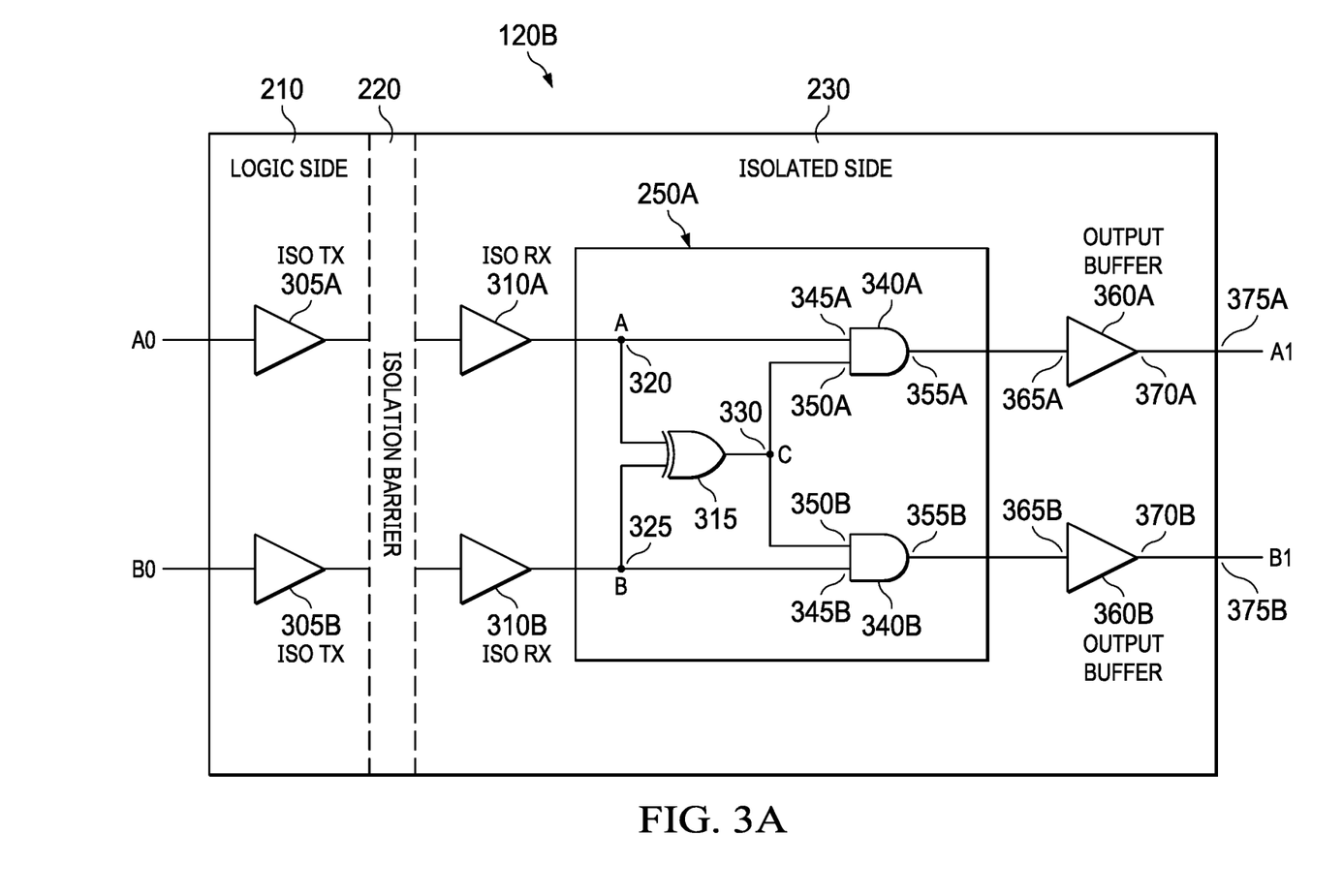
FIGS. 3A, 3B and 3C are circuit diagrams of example logic circuits to implement the multi-channel isolator with an interlock circuit shown in FIG. 2B.
Figure 3B:
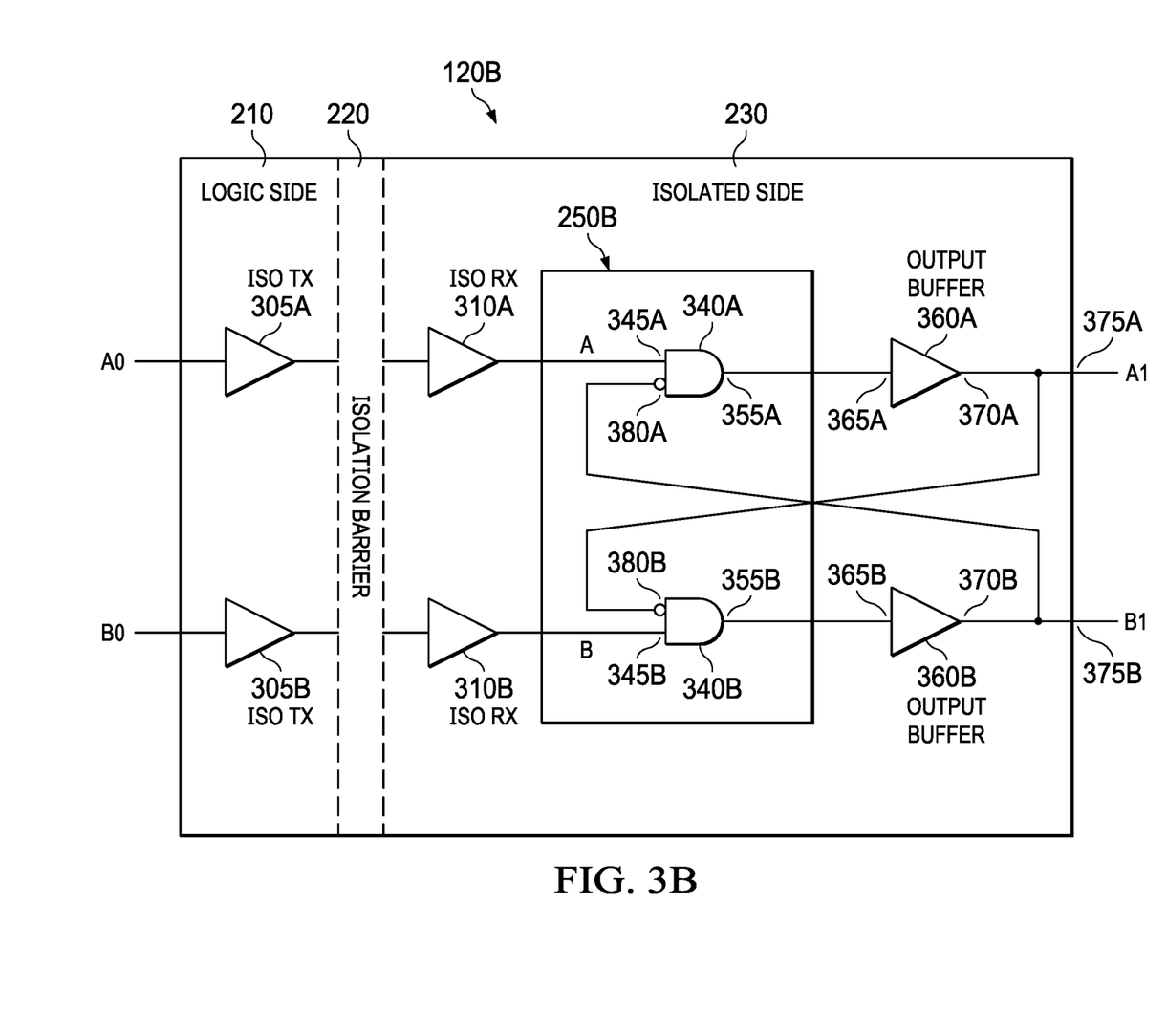
Figure 3C:
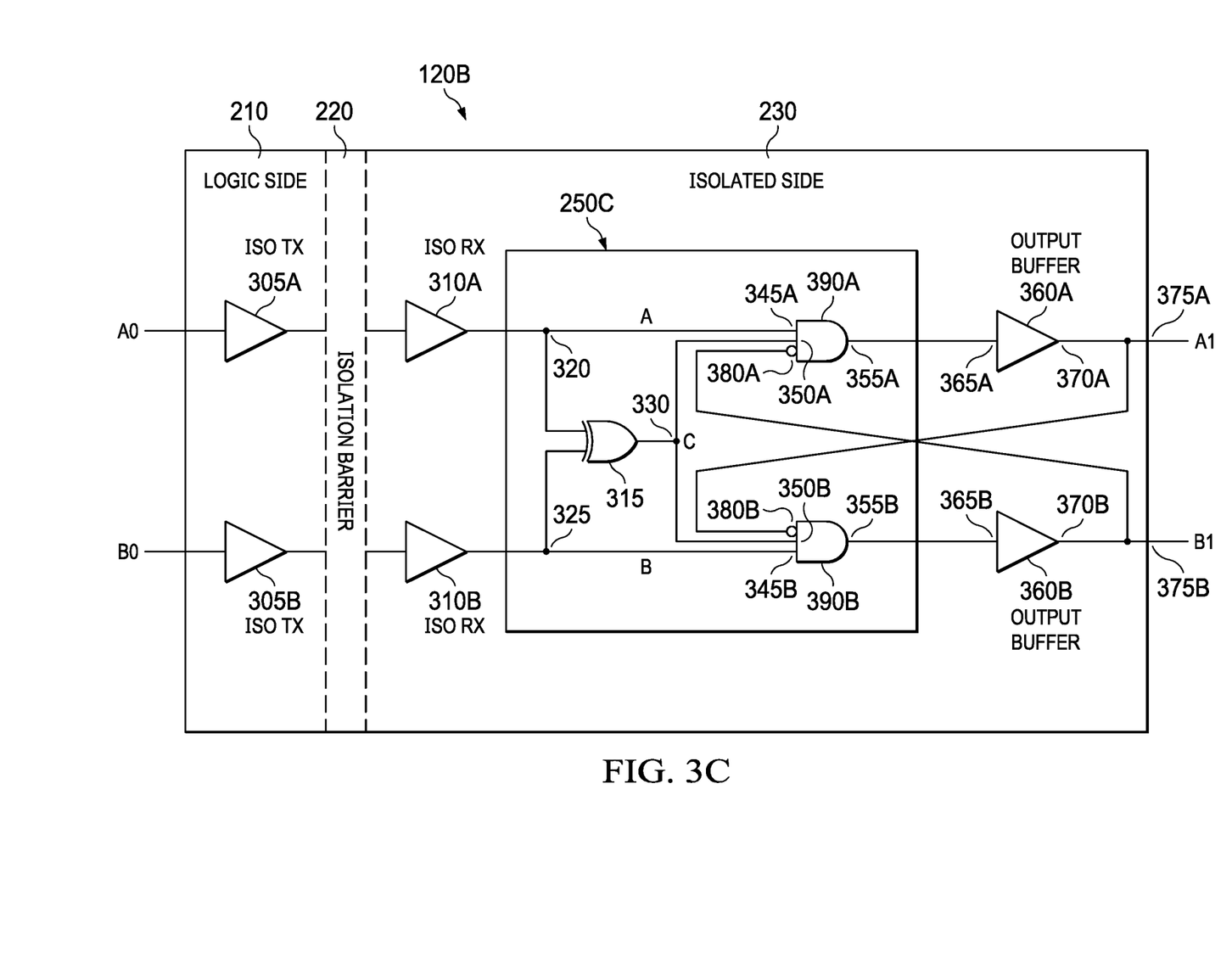

FIGS. 3A-C illustrate example logic circuits for one channel of the multi-channel isolator 120B with an interlock circuit 250 shown in FIG. 2B. In FIG. 3A, isolator 120B includes isolation (ISO) transmitters (TXs) 305A and 305B on the logic side 210 of the isolation barrier 220, and ISO receivers (RXs) 310A and 310B, exclusive OR (XOR) gate 315, AND gates 320A and 320B, and output buffers 330A and 330B on the isolation side 230 of the isolation barrier 220. ISO TXs 305A-B receive the input PWM control signals A0 and B0, respectively, and transmit them over the isolation barrier 220 to ISO RXs 310A-B, respectively. The ISO RXs 310A-B output intermediate signals A and B as shown in FIG. 3A. For example, the ISO TXs 305A-B may be opto-transmitters and output optical signals based on the input PWM control signals A0 and B0, respectively. The ISO RXs 310A-B may be photodiodes and receive the optical signals transmitted by ISO TXs 305A-B.

ISO RX 310A outputs the intermediate signal A to a first input 320 of XOR gate 315 and to a first input 345A of AND gate 340A within the interlock circuit 250A. ISO RX 310B outputs the intermediate signal B to a second input 325 of XOR gate 315 and to a first input 345B of AND gate 340B. The output 330 of XOR gate 315 is coupled to a second input 350A of AND gate 340A and to a second input 350B of AND gate 340B. XOR gate 315 outputs an intermediate signal C that is logic high in response to one (but not both) of intermediate signals A or B being logic high, which indicates that intermediate signals A and B are complementary and not overlapping due to a fault (e.g., software fault or faults introduced within isolator 120B).

The output 355A of AND gate 340A provides the intermediate signal A to an input 365A of output buffer 360A outside the interlock circuit 250A while the intermediate signal C from XOR gate 315 indicates that intermediate signals A and B are not overlapping. The output 370A of output buffer 360A provides the isolated PWM control signal A1 to a first channel output 375A of isolator 120B. The output 355B of AND gate 340B provides the intermediate signal B to an input 365B of output buffer 360B outside the interlock circuit 250A while the intermediate signal C from XOR gate 315 indicates that intermediate signals A and B are not overlapping. The output 370B of output buffer 360B provides the isolated PWM control signal B1 to a second channel output 375B of isolator 120B.

The interlock circuit 250A in FIG. 3A can correct for software faults or faults introduced in ISO RXs 310A-B, but does not correct for faults due to the traces for isolated PWM control signals A1 and B1. In addition, errors can be present in isolated PWM control signals A1 and B1 due to a propagation delay of XOR gate 315. In FIG. 3B, interlock circuit 250B corrects for software faults and faults introduced in ISO RXs 310A-B, as well as faults due to the output buffers 360A-B and the traces for isolated PWM control signals A1 and B1. Interlock circuit 250B in FIG. 3B omits the XOR gate 315 of FIG. 3A. Instead, the output 370A of output buffer 360A is coupled to an inverting input 380B of AND gate 340B and provides the isolated PWM control signal A1, and the output 370B of output buffer 360B is coupled to an inverting input 380A of AND gate 340A and provides the isolated PWM control signal B1.

The output 355A of AND gate 340A provides the intermediate signal A to the input 365A of output buffer 360A outside interlock circuit 250B while isolated PWM control signal B1 is logic low, preventing faults due to the output buffers 360A-B or the traces for isolated PWM control signals A1 and B1 from causing errors. The output 370A of output buffer 360A provides the isolated PWM control signal A1 to the first channel output 375A of isolator 120B and to the inverting input 380B of AND gate 340B. Similarly, an output 355B of AND gate 340B provides the intermediate signal B to the input 365B of output buffer 360B outside interlock circuit 250B while isolated PWM control signal A1 is logic low, and the output 370B of output buffer 360B provides the isolated PWM control signal B1 to the second channel output 375B of isolator 120B and to the inverting input 380A of AND gate 340A.

If the intermediate signals A and B are stuck at logic high, the non-inverting inputs 345A-B of the AND gates 340A-B stay logic high. The outputs 355A-B of the AND gates 340A-B depend on the inverted values of the isolated PWM control signals B1 and A1. Propagation delays through output buffers 360A-B and inverting inputs 380A-B can cause the isolated PWM control signals B1 and A1 to continuously toggle as they are inverted and input to AND gates 340A-B.

Interlock circuit 250C in FIG. 3C is similar to interlock circuit 250B shown in FIG. 3B, but also includes the XOR gate 315 in interlock circuit 250A shown in FIG. 3A to prevent continuous toggling of isolated PWM control signals A1 and B1 if the intermediate signals A and B remain at a logic high. The intermediate signal C output from XOR gate 315 is provided to a third, non-inverting input 350A of AND gate 390A and to a third, non-inverting input 350B of AND gate 390B. The AND gate 390A outputs a logic high only when the non-inverting inputs 345A and 350A are logic high and the inverting input 380A is logic low. That is, the output 355A of AND gate 390A provides the intermediate signal A to the input 365A of output buffer 360A outside the interlock circuit 250C while isolated PWM control signal B1 is logic low and intermediate signal C indicates only one of intermediate signals A and B is logic high.

Similarly, the AND gate 390B outputs a logic high only when the non-inverting inputs 345B and 350B are logic high and the inverting input 380B is logic low. That is, the output 355B of AND gate 390B provides the intermediate signal B to the input 365B of output buffer 360B outside the interlock circuit 250C while isolated PWM control signal A1 is logic low and intermediate signal C indicates that only one of intermediate signals A and B is logic high. The intermediate signal C output from XOR gate 315 is logic high in response to one (but not both) of intermediate signals A or B being logic high, which indicates that intermediate signals A and B are complementary and not overlapping due to a fault (e.g., software fault or faults introduced within isolator 120B). If the intermediate signals A and B remain at a logic high, the XOR gate 315 outputs a logic low, effectively gating off the A1 and B1 signals. The logic circuits shown in FIGS. 3A-C are examples only, and other logic gates and combination of logic gates may be used.

As discussed above, PWM controllers often insert a dead time in the PWM control signals to a pair of transistors to prevent the transistors from being on at the same time which otherwise might occur due to propagation delays through the system and a slower turn-off than turn-on for transistors in the power driver. During the dead time, both PWM control signals A1 and B1 are de-asserted to maintain the transistors in an off state (e.g., A1 and B1 being logic low if the transistors are n-type, such as NPN BJTs or nMOSFETs, and A1 and B1 being logic high if the transistors are p-type, such as PNP BJTs or pMOSFETs).

Figure 4A:
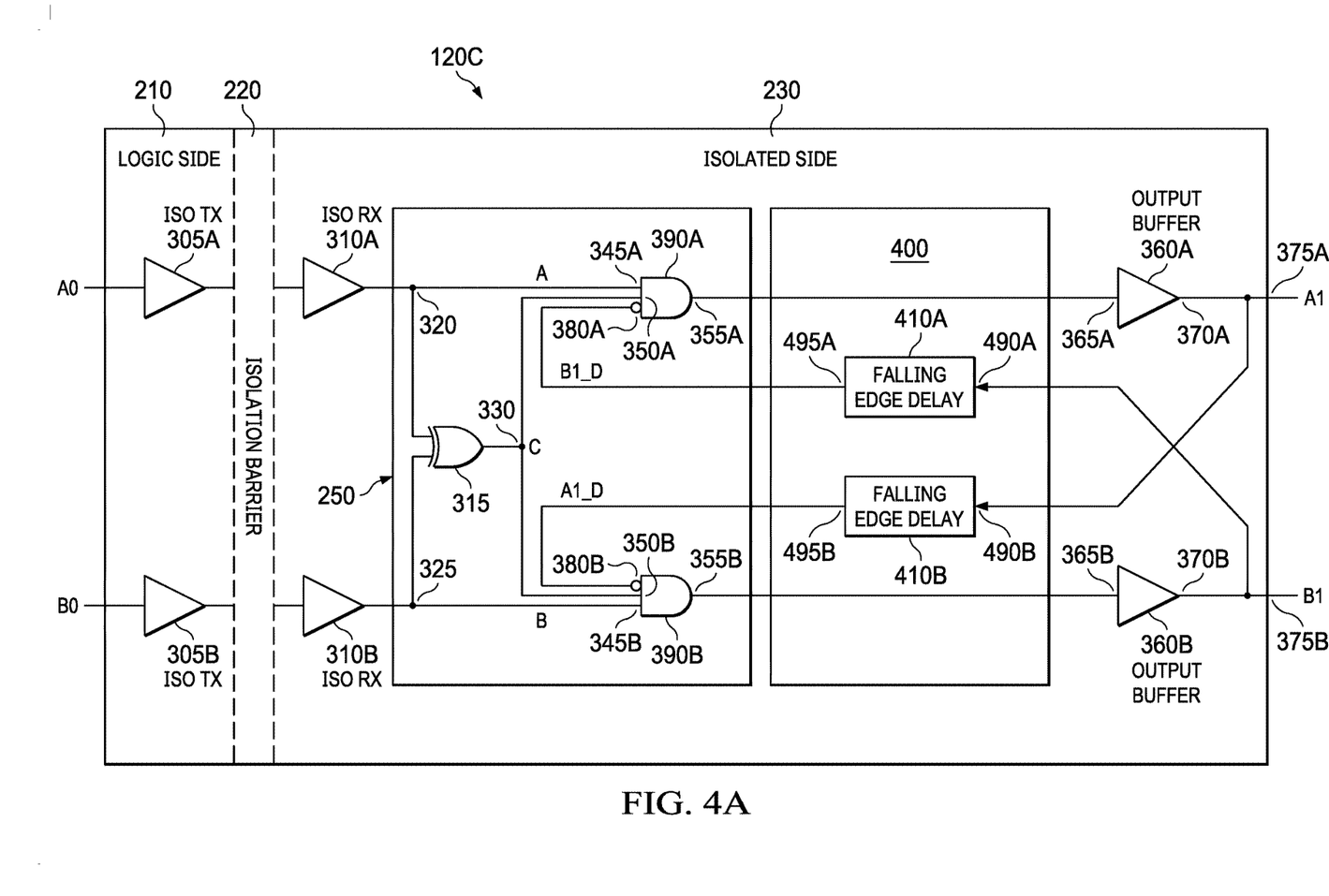
FIG. 4A is a circuit diagram of an example logic circuit for a multi-channel isolator with an interlock circuit and a dead-time insertion circuit.
Figure 4B:
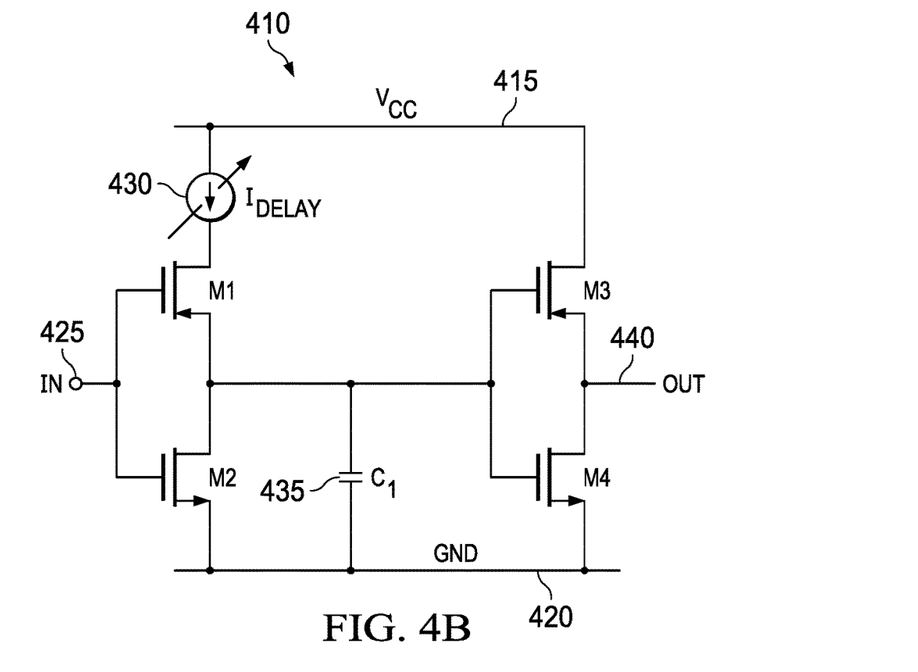
FIG. 4B is a circuit diagram of an example delay circuit for the multi-channel isolator of FIG. 4A.
Figure 4C:
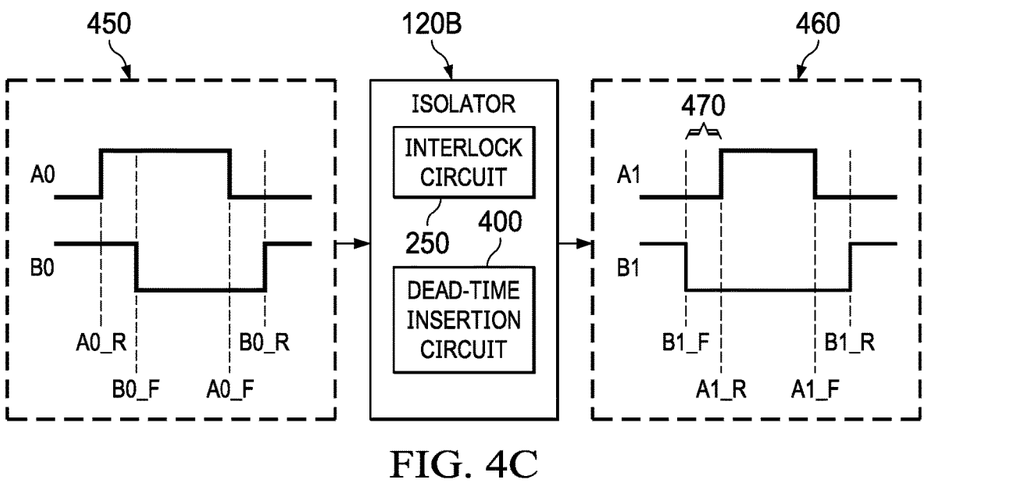
FIG. 4C is a timing diagrams of input and output signals of the multi-channel isolator of FIG. 4A.

Some systems include separate dead time insertion circuits, increasing the area and cost of the integrated circuit dies. Some systems program the dead time into the PWM control signals A0 and B0, increasing the complexity of control signal generation. FIGS. 4A-C illustrate a logic circuit for a multi-channel isolator 120C with an integrated interlock circuit 250 and a dead-time insertion circuit 400. In some examples, the dead-time insertion circuit 400 is integrated onto the same semiconductor die as the interlock circuit 250 and the multi-channel isolator 120C.

Isolator 120C shown in FIG. 4A includes an interlock circuit 250 similar to the interlock circuit 250C shown in FIG. 3C, although the interlock circuit 250B shown in FIG. 3B or any appropriate interlock circuit using A1 and B1 as feedback can be used instead. In addition to the interlock circuit 250, isolator 120C shown in FIG. 4A includes a dead time insertion circuit 400 with two falling edge delay circuits 410A and 410B, which receive isolated PWM control signals B1 and A1, respectively.

The input 490A of delay circuit 410A is coupled to the output 370B of output buffer 360B, and the output 495A of delay circuit 410A is coupled to an inverting input 380A of AND gate 390A in interlock circuit 250. The falling edge delay circuit 410A delays the isolated PWM control signal B1 by a configurable dead time, for example 10 nanoseconds, and outputs a delayed isolated PWM control signal B1_D. Similarly, the input 490B of delay circuit 410B is coupled to the output 370A of output buffer 360A, and the output 495B of delay circuit 410B is coupled to an inverting input 380B of AND gate 390B in interlock circuit 250. The falling edge delay circuit 410B delays the isolated PWM control signal A1 by a configurable dead time, for example, 10 nanoseconds, and outputs a delayed isolated PWM control signal A1_D.

The delayed, isolated PWM control signals A1_D and B1_D ensure that isolated PWM control signal B1 becomes logic high after the inserted dead time has elapsed from the isolated PWM control signal A1 transitioning to logic low and that isolated PWM control signal A1 becomes logic high after the inserted dead time has elapsed from the isolated PWM control signal B1 transitioning to logic low. FIG. 4B shows an example falling edge delay circuit 410 which can be used to implement either or both of the falling edge delay circuits 410A or 410B of FIG. 4A.

Delay circuit 410 includes transistors M1, M2, M3 and M4, current source 430, and capacitor C1 435. Transistors M1 and M3 are P-type MOSFETs (PMOS), and transistors M2 and M4 are N-type MOSFETs (NMOS) in this example (thereby forming two inverters, M1/M2 and M3/M4). In other examples, one or more of transistors M1 and M3 are NMOS or BJTs, and/or one or more of transistors M2 and M4 are PMOS or BJTs. Current source 430 is coupled to a supply voltage rail Vcc 415 (e.g., 3.3 volts) and outputs a current, Idelay, to a source terminal of M1.

A source terminal of M1 is coupled to a drain terminal of M2, and a source terminal of M2 is coupled to a common potential (e.g. ground) 420. Gate terminals of M1 and M2 are coupled to an input node 425 of delay circuit 410, which receives isolated PWM control signal A1 or B1. A first terminal of capacitor C1 435 is coupled to the source terminal of M1, the drain terminal of M2, and the gates of M3 and M4. A second terminal of capacitor C1 435 is coupled to ground 420. A drain terminal of M3 is coupled to the supply voltage rail 415, and a source terminal of M3 is coupled to a drain terminal of M4 and to an output node 440 of delay circuit 410, which outputs A1_D or B1_D. A source terminal of M4 is coupled to ground 420.

The signal (A1 or B1) on the input node 425 is provided to the gates of M1 and M2, and the voltage across the capacitor C1 435 is provided to the gates of M3 and M4. When the input node signal is logic high, M2 is on and M3 is off. While in this state, any charge on the capacitor C1 435 is discharged through M2, and thus the voltage to the gates of M3 and M4 is logic low thereby forcing M4 off and M3 on. With M3 being on, the signal on the output node 440 is pulsed high to Vcc.

However, the signal (A1 or B1) at input node 425 transitioning from logic high to logic low causes M1 to turn on and M2 to turn off. With M1 being on, current from the current source 430 flows to and charges the capacitor C1 435. The voltage across the capacitor C1 435 then begins to increase linearly. While a voltage across the capacitor C1 435 is still less than the threshold voltage (Vt) of the transistors, M3 remains on and M4 remains off, thereby causing the signal at output node 440 to remain logic high.

As the voltage across the capacitor C1 435 increases above the threshold voltage of M4, M4 turns on and M3 turns off. Upon M4 being turned on, the voltage on the output node 440 is pulled to ground 420. Accordingly, the current source 430 and the capacitor C1 435 implement a delay between a high to low signal transition on the input node and a high to low signal transition on the output node 440.

A capacitance of capacitor C1 435 and the current $I_{DELAY}$ from current source 430 can be chosen to adjust the length of delay. Specifically, by selecting these values, the time to charge the capacitor C1 435 above the threshold voltage is adjusted thereby changing the delay before the signal at output node 440 becomes logic low as well. For example, to increase the delay, the magnitude of $I_{DELAY}$ can be reduced and/or the capacitance of capacitor C1 435 can be increased. To decrease the delay, the magnitude of $I_{DELAY}$ can be increased and/or the capacitance of capacitor C1 435 can be decreased. For example, the capacitance of capacitor C1 435 and the magnitude of $I_{DELAY}$ can be chosen to implement a 10 nanosecond delay, that is, dead time, in the delayed, isolated PWM output signals A1_D and B1_D. Although delay circuits 410A-B shown in FIG. 4A and delay circuit 410 shown in FIG. 4B are falling edge delay circuits, any appropriate kind of delay circuit may be used, such as a rising edge delay circuit, an RC time delay circuit, one or more serially-coupled flip-flops, etc.

FIG. 4C illustrates timing diagrams of signals input to and output from the isolator 120B shown in FIG. 4A with an interlock circuit 250 and a dead time insertion circuit 400. The timing diagrams in FIG. 4C show examples of PWM control signals A0 and B0 and isolated PWM control signals A1 and B1 as active high, but in other implementations PWM control signals A0 and B0 and isolated PWM control signals A1 and B1 can be active low. Timing diagram 450 shows the overlapping PWM control signals A0 and B0 input to isolator 120B. The falling edge B0_F of B0 occurs after the rising edge A0_R of A0 due to, for example, a software fault, such that A0 and B0 are active high at the same time.

Timing diagram 460 shows the delayed, isolated PWM control signals A1 and B1 output from isolator 120B, which corrects the overlapping active highs and inserts a dead time 470 between the falling edge B1_F of B1 and the rising edge A1_R of A1. In an implementation in which A0 and B0 are active low, the rising edge B0_R for B0 occurs after the falling edge A0_F for A0, such that both A0 and B0 are active low at the same time. In the active low implementation, the isolator 120B corrects the overlapping active lows in A0 and B0 and inserts a dead time 470 between the rising edge B1_R of B1 and the falling edge A1_F of A1. The delays introduced by the charging and discharging of capacitor C1 435 and the switching of transistors M1 and M4 in delay circuit 410 also introduce a delay before the AND gates 390A-B output an active signal.

For example, the isolated PWM logic signal B1 transitions from active to inactive. Without a dead-time insertion circuit 400, the inverting input 380A of AND gate 390A would then transition from inactive to active and enable the AND gate 390A to output an active signal if the intermediate signal A is active. With a dead-time insertion circuit 400, the delay introduced by the charging of capacitor C1 435 and the switching of transistors M1-M4 causes the inverting input 380A of AND gate 390A to continue providing an inactive signal for the length of the inserted dead time, for example 10 nanoseconds, before transitioning to active and enabling the AND gate 390A to output an active signal if the intermediate signal A is active.

Figure 5:
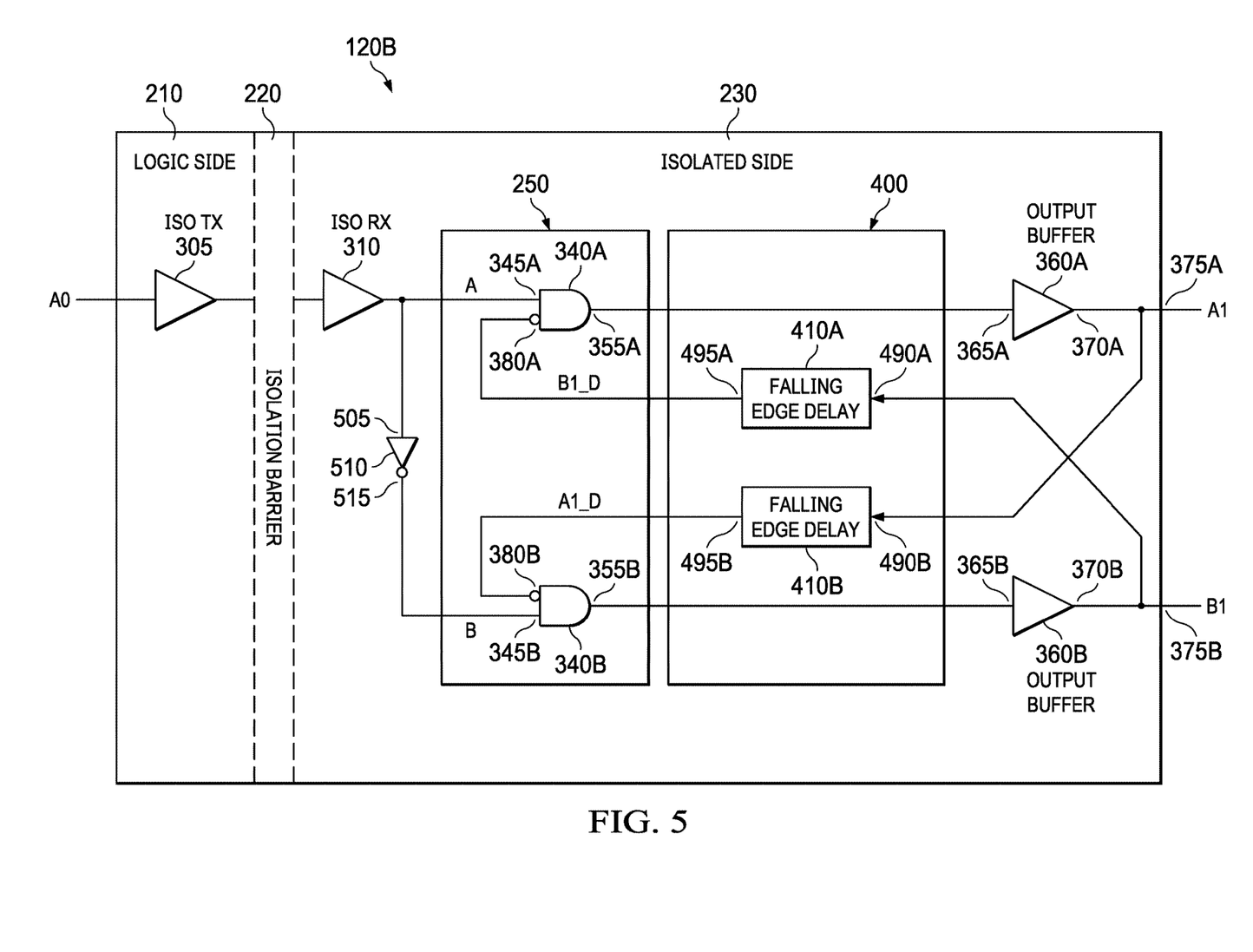
FIG. 5 is a circuit diagram of an example logic circuit for a multi-channel isolator with an interlock circuit and a dead-time insertion circuit with a reduced number of input pins compared to the examples of FIGS. 3A-C and 4A.

FIG. 5 illustrates an example logic circuit for one channel of the multi-channel isolator 120B with an interlock circuit 250 and a dead-time insertion circuit 400 with a reduced number of input pins. Interlock circuit 250 in FIG. 5 is similar to the interlock circuit 250 shown in FIG. 3B, but the inverting input 380A of AND gate 320A receives the delayed, isolated PWM signal B1_D from the falling edge delay circuit 410A in the dead-time insertion circuit 400 and the inverting input 380B of AND gate 320B receives the delayed, isolated PWM signal A1_D from the falling edge delay circuit 410B in the dead-time insertion circuit 400 instead of the isolated PWM signals B1 and A1, respectively.

Isolator 120B shown in FIG. 5 includes one ISO TX 305 and one ISO RX 310, and receives a single PWM control signal A0. Isolator 120B generates the intermediate signal B on the isolated side of isolator 120B based on the intermediate signal A using an inverter 510. An input 505 of the inverter 510 is coupled to the ISO RX 310, and an output 515 of the inverter 510 is coupled to the input 345B of the AND gate 340B. The inverter 510 outputs the complement of the intermediate signal A as the intermediate signal B.

The complementary signal B of the input PWM control signal A0 can be generated during the dead time introduced by dead-time insertion circuit 400, reducing the number of input pins on the isolator 120B and the size of isolator 120B. However, generating the complementary signal B based on the input PWM control signal A0 precludes independent control of transistors in the power driver, and so the system 100 incorporates additional circuitry on the isolated side of the system to turn off both high side and low side transistors at the same time.

In this description, the term "couple" may cover direct and indirect connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

The uses of the phrase "ground voltage potential" in this description include a chassis ground, an Earth ground, a floating ground, a virtual ground, a digital ground, a common ground, and/or any other form of ground connection applicable to, or suitable for, the teachings of this description. Unless otherwise stated, "about", "approximately", or "substantially" preceding a value means +/−10 percent of the stated value.

As used herein, the terms "terminal", "node", "interconnection", "lead" and "pin" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead. For example, a p-type metal-oxide-silicon field effect transistor ("MOSFET") may be used in place of an n-type MOSFET with little or no changes to the circuit. Furthermore, other types of transistors may be used (such as bipolar junction transistors (BJTs)).

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Modifications are possible in the described embodiments, and other embodiments are possible, within the scope of the claims.

What is claimed is:

1. A digital isolator, comprising:
    a transmitter having a transmitter output;
    a receiver having a receiver input and a receiver output;
    an isolation barrier coupled between the transmitter output and the receiver input, the transmitter configured to transmit an input signal across the isolation barrier;
    an output buffer having a buffer input, the output buffer configured to output an isolated signal; and
    an interlock circuit having an interlock input coupled to the receiver output and an interlock output coupled to the buffer input, the interlock circuit configured to prevent overlapping active states between the isolated signal and a complementary isolated signal.

2. The digital isolator of claim 1, wherein:
    the digital isolator further comprises:
        an inverter having an inverter input and an inverter output, the inverter input coupled to the receiver output; and
        a complementary output buffer having a complementary buffer input, the complementary output buffer configured to output the complementary isolated signal; and
    the interlock circuit further comprises a complementary interlock input coupled to the inverter output and a complementary interlock output coupled to the complementary buffer input.

3. The digital isolator of claim 1, wherein the digital isolator further comprises:
    a complementary transmitter having a complementary transmitter output and configured to transmit a complementary input signal across the isolation barrier;
    a complementary receiver having a complementary receiver input and a complementary receiver output; and
    a complementary output buffer having a complementary buffer input, the complementary output buffer configured to output the complementary isolated signal, wherein the isolation barrier is further coupled between the complementary transmitter output and the complementary receiver input, and wherein the interlock circuit further comprises a complementary interlock input coupled to the complementary receiver output and a complementary interlock output coupled to the complementary buffer input.

4. The digital isolator of claim 3, wherein:
    the output buffer comprises a buffer output and the complementary output buffer comprises a complementary buffer output;
    the interlock circuit further comprises a feedback input and a complementary feedback input; and
    the digital isolator further comprises a dead-time insertion circuit, the dead-time insertion circuit having:
        a first input coupled to the complementary buffer output,
        a second input coupled to the buffer output,
        a first output coupled to the feedback input, and
        a second output coupled to the complementary feedback input.

5. The digital isolator of claim 4, wherein the dead-time insertion circuit is configured to insert a dead time between a falling edge of the isolated signal and a rising edge of the complementary isolated signal.

6. The digital isolator of claim 4, wherein the dead-time insertion circuit is configured to insert a dead time between a rising edge of the isolated signal and a falling edge of the complementary isolated signal.

7. The digital isolator of claim 3, wherein the interlock circuit comprises:
an exclusive OR (XOR) logic gate having a first input coupled to the interlock input, a second input coupled to the complementary interlock input, and an XOR output;
a first AND logic gate having a first input coupled to the interlock input, a second input coupled to the XOR output, and an output coupled to the interlock output; and
a second AND logic gate having a first input coupled to the complementary interlock input, a second input coupled to the XOR output, and an output coupled to the complementary interlock output.

8. The digital isolator of claim 3, wherein the output buffer comprises a buffer output and the complementary output buffer comprises a complementary buffer output, the interlock circuit further comprising:
a feedback input coupled to the complementary buffer output;
a complementary feedback input coupled to the buffer output;
a first AND logic gate having an input coupled to the interlock input, an inverting input coupled to the feedback input, and an output coupled to the interlock output; and
a second AND logic gate having an input coupled to the complementary interlock input, an inverting input coupled to the complementary feedback input, and an output coupled to the complementary interlock output.

9. The digital isolator of claim 8, further comprising a dead-time insertion circuit, wherein the dead-time insertion circuit comprises:
a first dead-time input coupled to the complementary buffer output;
a second dead-time input coupled to the buffer output;
a first dead-time output coupled to the feedback input;
a second dead-time output coupled to the complementary feedback input;
a first delay circuit having an input coupled to the first dead-time input and an output coupled to the first dead-time output; and
a second delay circuit having an input coupled to the second dead-time input and an output coupled to the second dead-time output.

10. The digital isolator of claim 3, wherein the output buffer comprises a buffer output and the complementary output buffer comprises a complementary buffer output, the interlock circuit further comprising:
a feedback input coupled to the complementary buffer output;
a complementary feedback input coupled to the buffer output;
an exclusive OR (XOR) logic gate having a first input coupled to the interlock input, a second input coupled to the complementary interlock input, and an XOR output;
a first AND logic gate having a first input coupled to the interlock input, second input coupled to the XOR output, a first inverting input coupled to the feedback input, and an output coupled to the interlock output; and
a second AND logic gate having a third input coupled to the complementary interlock input, a fourth input coupled to the XOR output, a second inverting input coupled to the complementary feedback input, and an output coupled to the complementary interlock output.

11. An apparatus, comprising:
a first transmitter having a first transmitter output;
a first receiver having a first receiver input and a first receiver output;
a second transmitter having a second transmitter output;
a second receiver having a second receiver input and a second receiver output;
an isolation barrier coupled between the first transmitter output and the first receiver input and between the second transmitter output and second receiver input; and
a first output buffer having a first buffer input, the first output buffer configured to output a first isolated signal; and
a second output buffer having a second buffer input, the second output buffer configured to output a second isolated signal; and
an interlock circuit comprising:
an XOR gate having a first XOR input, a second XOR input, and an XOR output, the first XOR input coupled to the first receiver output and the second XOR input coupled to the second receiver output
a first AND gate having a first AND input, a second AND input and a first AND output, the first AND input coupled to the first receiver output, the second AND input coupled to the XOR output, and the first AND output coupled to the first buffer input and
a second AND gate having a third AND input, a fourth AND input, and a second AND output, the third AND input coupled to the XOR output, the fourth AND input coupled to the second receiver output, and the second AND output coupled to the second buffer input.

12. The apparatus of claim 11, wherein the first transmitter is configured to transmit a first input signal across the isolation barrier, the second transmitter is configured to transmit a second input signal across the isolation barrier.

13. The apparatus of claim 12, wherein:
the first output buffer comprises a first buffer output and the second output buffer comprises a second buffer output;
the first AND gate further has a fifth AND input;
the second AND gate further has a sixth AND input; and
the apparatus further comprising a dead-time insertion circuit having:
a first dead-time input coupled to the second buffer output;
a second dead-time input coupled to the first buffer output;
a first dead-time output coupled to the fifth AND input; and
a second dead-time output coupled to the sixth AND input.

14. The apparatus of claim 13, wherein the dead-time insertion circuit is configured to insert a dead time between a falling edge of the first isolated signal and a rising edge of the second isolated signal.

15. The apparatus of claim 13, wherein the dead-time insertion circuit is configured to insert a dead time between a rising edge of the first isolated signal and a falling edge of the second isolated signal.

16. The apparatus of claim 12, wherein the interlock circuit is configured to prevent overlapping active states between the first and second isolated signals.

17. A digital isolator comprising:
a first receiver having a first receiver output and configured to receive a first input signal across an isolation barrier;
a first output buffer having a first buffer input and configured to output a first isolated signal;
a second receiver having a second receiver output and configured to receive a second input signal across the isolation barrier;
a second output buffer having a second buffer input and configured to output a second isolated signal; and
an interlock circuit having a first input coupled to the first receiver output, a second input coupled to the second receiver output, a first output coupled to the first buffer input, and a second output coupled to the second buffer input, the interlock circuit configured to prevent overlapping active states between the first and second isolated signals.

18. The digital isolator of claim 17, wherein:
the first output buffer comprises a first buffer output and the second output buffer comprises a second buffer output;
the interlock circuit further comprises a first feedback input and a second feedback input; and
the digital isolator further comprising a dead-time insertion circuit having:
a first dead-time input coupled to the second buffer output;
a second dead-time input coupled to the first buffer output;
a first dead-time output coupled to the first feedback input; and
a second dead-time output coupled to the second feedback input.

19. The digital isolator of claim 18, wherein the dead-time insertion circuit comprises:
a first delay circuit having an input coupled to the first dead-time input and an output coupled to the first dead-time output; and
a second delay circuit having an input coupled to the second dead-time input and an output coupled to the second dead-time output.

20. The digital isolator of claim 19, wherein the interlock circuit comprises:
a first AND logic gate having a first input coupled to the first input of the interlock circuit, a first inverting input coupled to the first feedback input, and a first output coupled to the first output of the interlock circuit; and
a second AND logic gate having a second input coupled to the second input of the interlock circuit, a second inverting input coupled to the second feedback input, and a second output coupled to the second output of the interlock circuit.

21. The digital isolator of claim 19, wherein the interlock circuit comprises:
an exclusive OR (XOR) logic gate having a first input coupled to the first input of the interlock circuit, a second input coupled to the second input of the interlock circuit, and an XOR output;
a first AND logic gate having a first input coupled to the first input of the interlock circuit, a second input coupled to the XOR output, a third inverting input coupled to the first feedback input, and an output coupled to the first output of the interlock circuit; and
a second AND logic gate having a fourth input coupled to the second input of the interlock circuit, a fifth input coupled to the XOR output, a sixth inverting input coupled to the second feedback input, and an output coupled to the second output of the interlock circuit.

22. A motor driver having an output adapted to be coupled to a motor, the motor driver comprising:
first circuitry having a first output and adapted to be coupled to a first voltage supply;
second circuitry having a first input, a second input and a second output adapted to be coupled to the motor, the second circuitry adapted to be coupled to a second voltage supply that is greater than the first voltage supply; and
an isolation barrier coupled between the first circuitry and the second circuitry thereby isolating the first circuitry from the second circuitry; and
wherein the second circuitry includes:
an interlock circuit having a third input coupled to the first input, a fourth input coupled to the second input, a third output and a fourth output;
a first buffer circuit having a fifth input coupled to the third output and having a fifth output coupled to the interlock circuit; and
a second buffer circuit having a sixth input coupled to the fourth output and having a sixth output coupled to the interlock circuit; and
wherein a signal at the fifth output is asserted only if a signal at the sixth output is de-asserted.

* * * * *